United States Patent [19]

Carter

[11] Patent Number: 5,099,199

[45] Date of Patent: Mar. 24, 1992

[54] DEVICE FOR TESTING FUSES

[75] Inventor: David F. Carter, Kenner, La.

[73] Assignee: Milton J. LeFebre, Covington, La.

[21] Appl. No.: 592,200

[22] Filed: Oct. 3, 1990

[51] Int. Cl.⁵ ............... G01R 31/02; H01H 85/30
[52] U.S. Cl. .................................. 324/550; 324/133
[58] Field of Search ........................ 324/550, 133

[56] References Cited

U.S. PATENT DOCUMENTS

| | | | |
|---|---|---|---|
| 1,645,346 | 10/1927 | Palmer | 324/550 X |
| 2,162,197 | 6/1939 | Dodge | 200/121 |
| 2,206,787 | 7/1940 | Linton | 200/119 |
| 2,225,912 | 12/1940 | La Mar | 200/121 |
| 2,586,366 | 2/1952 | McNamara | 324/550 X |
| 2,742,545 | 4/1956 | Sundt | 200/121 |
| 2,758,295 | 8/1956 | Sundt | 340/250 |
| 2,855,483 | 10/1958 | Swing et al. | 200/121 |
| 3,047,695 | 7/1962 | Borys | 200/121 |
| 4,025,888 | 5/1977 | Judd et al. | 337/266 |
| 4,149,215 | 4/1979 | Strich | 361/331 |
| 4,281,322 | 7/1981 | Nasu et al. | 340/638 |
| 4,443,780 | 4/1984 | Huai-Chieh | 337/257 |
| 5,008,626 | 4/1991 | Boyd, Sr. | 324/133 X |

Primary Examiner—Kenneth A. Wieder
Assistant Examiner—Glenn W. Brown
Attorney, Agent, or Firm—Pravel, Gambrell, Hewitt, Kimball & Krieger

[57] ABSTRACT

A device for testing various sized fuses independent of an electrical circuit. The device includes a main body with receptacles for receiving a variety of sized fuses, electrically insulated conducting elements on opposing sides of the receptacles for contacting connection points on the fuses, a power source, and an indicator in contact with the conducting elements so that when an operative fuse is inserted in one of the receptacles, an electrical circuit is formed and power is supplied to the indicator.

20 Claims, 5 Drawing Sheets

DEVICE FOR TESTING FUSES

BACKGROUND OF THE INVENTION

1. Field of the Invention

The present invention relates generally to a device for indicating whether a fuse is operative or if it has blown.

Fuses are used in electrical systems to absorb any overload of current from the power source to the load. When the fuses are blown, the system served by the fuse is inoperative until the fuse is replaced. Often, however, it is difficult to determine whether a particular fuse is blown. Accordingly, a means for detecting when fuses are blown is necessary.

2. General Background

Fuse testers of various forms have been developed in the past, but those past testers have shortcomings regarding costs, ease of operation, and ability to test various sized fuses.

For example, U.S. Pat. No. 4,281,322 to Nasu et al. discloses a device for detecting blown fuses. Each of a plurality of fuses is arranged in series between a power source and a respective load. Light emitting diodes are connected between each of the fuses and its corresponding load. The diodes can be grounded by closing a switch, which cuts off the flow of current to the load and diverts the current through the diodes. In operation, closing the switch causes the light emitting diode connected to a particular fuse to light if the fuse is intact. If the fuse is blown, the corresponding diode will not light.

The Nasu et al. fuse testing device is incorporated with the electrical system and loads and does not test fuses independently of the system. This system uses a separate diode for each fuse, and there is no means for testing the light emitting diodes to insure that they are functioning properly.

U.S. Pat. No. 3,047,695 to Borys discloses a fuse testing system which is incorporated into a screw type cartridge fuse holder. The fuse tester is designed as a cartridge that houses both a single fuse and a testing apparatus. In the cartridge, a lamp and resistor are arranged in parallel relation to a fuse between a power source an a load. The fuse has a lower resistance than the resistor associated with the lamp. Thus, if the fuse is operable, current will flow from the power source to the load through the lower resistance fuse. If the fuse is blown, however, current will then flow through the lamp and resistor arrangement. Thus, a lit lamp indicates that the fuse is blown and an unlit lamp indicates that the fuse is intact.

Numerous other devices and systems have been designed for holding fuses and indicating when a fuse has been blown. Examples include those disclosed in U.S. Pat. Nos. 2,162,197 to Dodge; 2,206,787 to Linton; 2,225,912 to LaMar; 2,742,545 to Sundt; 2,758,295 to Sundt; 2,855,483 to Swing et al.; 4,025,888 to Judd et al.; 4,149,215 to Strich; and 4,443,780 to Huai-Chieh. While these devices and systems may be useful in indicating whether a particular fuse in a particular electrical application is in operation, the devices do not provide a simple and inexpensive device which can test fuses of various types and sizes, particularly fuses used in home and automobile systems which do not include sophisticated testing devices.

SUMMARY OF THE PRESENT INVENTION

The present invention overcomes the problems and disadvantages of the prior art by providing a simple and inexpensive device for testing a variety of different sized fuses. The device is independent from the electrical circuit in which the fuses are arranged and preferably includes its own electrical power source.

Thus, an object of the invention is to provide a simple and inexpensive device for testing fuses that is independent from the electrical circuit in which the fuse is arranged.

A further object of this invention is to provide a simple and inexpensive device for testing fuses that is capable of testing a variety of sized fuses.

Another object of the invention is to provide a device for testing fuses that includes a means for testing the indicator, so that the user can rely on the indicator to indicate the operability of the fuse alone.

Additional objects and advantages of the invention will be set forth in part in the description that follows, and in part will be obvious from the description, or may be learned by practice of the invention. The objects and advantages of the invention may be realized and attained by means of the elements and combinations particularly pointed out in the appended claims.

To achieve the objects and in accordance with the purposes of the invention, as embodied and broadly described herein, the fuse tester of the invention comprises a main body having a plurality of receptacles, each receptacle being sized to accommodate a fuse and at least one of its connection points; first conducting means associated with each of the receptacles for contacting one connection point of a fuse when it is inserted into one of the receptacles; second conducting means electrically insulated from the first conducting means, the second conducting means being associated with each of the receptacles for contacting the other connection point of a fuse when it is inserted into one of the receptacles; and indicating means for indicating the operability of the fuse, the indicating means being in electrical connection with one of the first and second conducting means; wherein when an operative fuse is inserted into a receptacle sized to accept it, an electrical circuit is formed to power the indicating means.

The receptacles preferably include hollow cylinders formed in the main body add elongated slots formed on at least one side of the main body. As additional preferred feature is an indicator test switch provided for forming an electrical connection between the conducting elements to periodically test the operability of the indicator and power source.

BRIEF DESCRIPTION OF THE DRAWINGS

For a further understanding of the nature and objects of the present invention, reference should be had to the following detailed description taken in conjunction with the accompanying drawings, in which like parts are given like reference numerals, and wherein.

DETAILED DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

The fuse testing device of the present invention includes a main body 10 having a plurality of receptacles 12 and 15, a first conductor 22, a second conductor 26, a battery 32, and an indicator light 30. As will be described below, the device is capable of testing fuses of various sizes in a simple and inexpensive manner.

Figure 1:
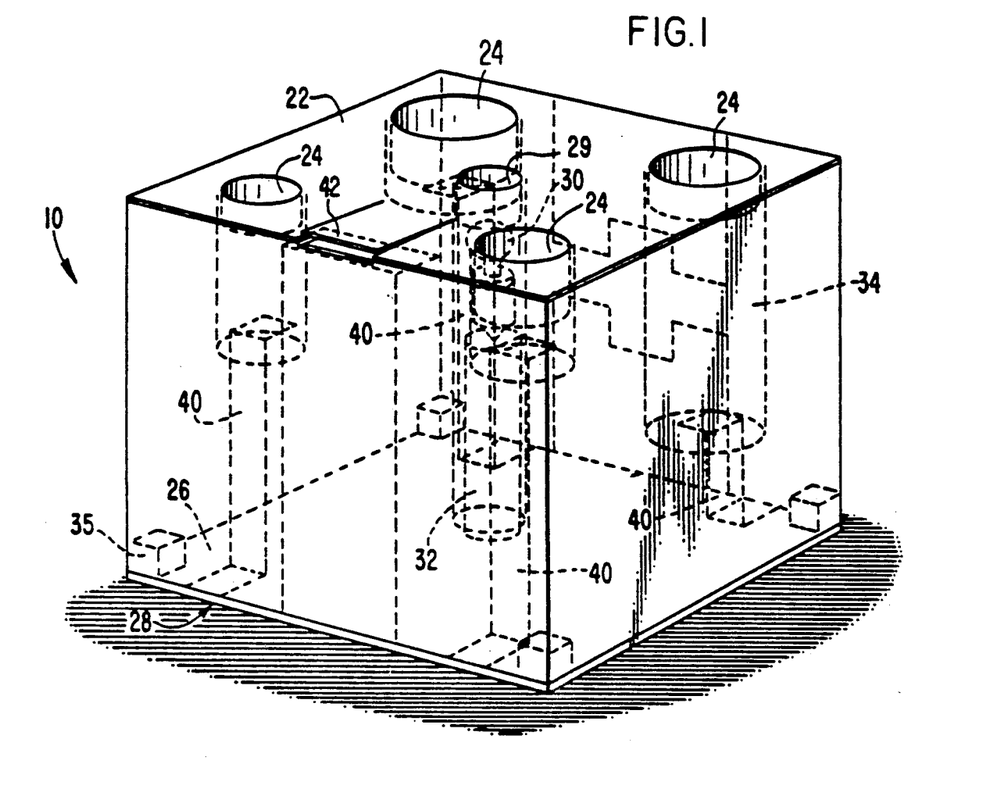
FIG. 1 is a perspective view of the fuse tester according to the preferred embodiment of the invention.
Figure 2:
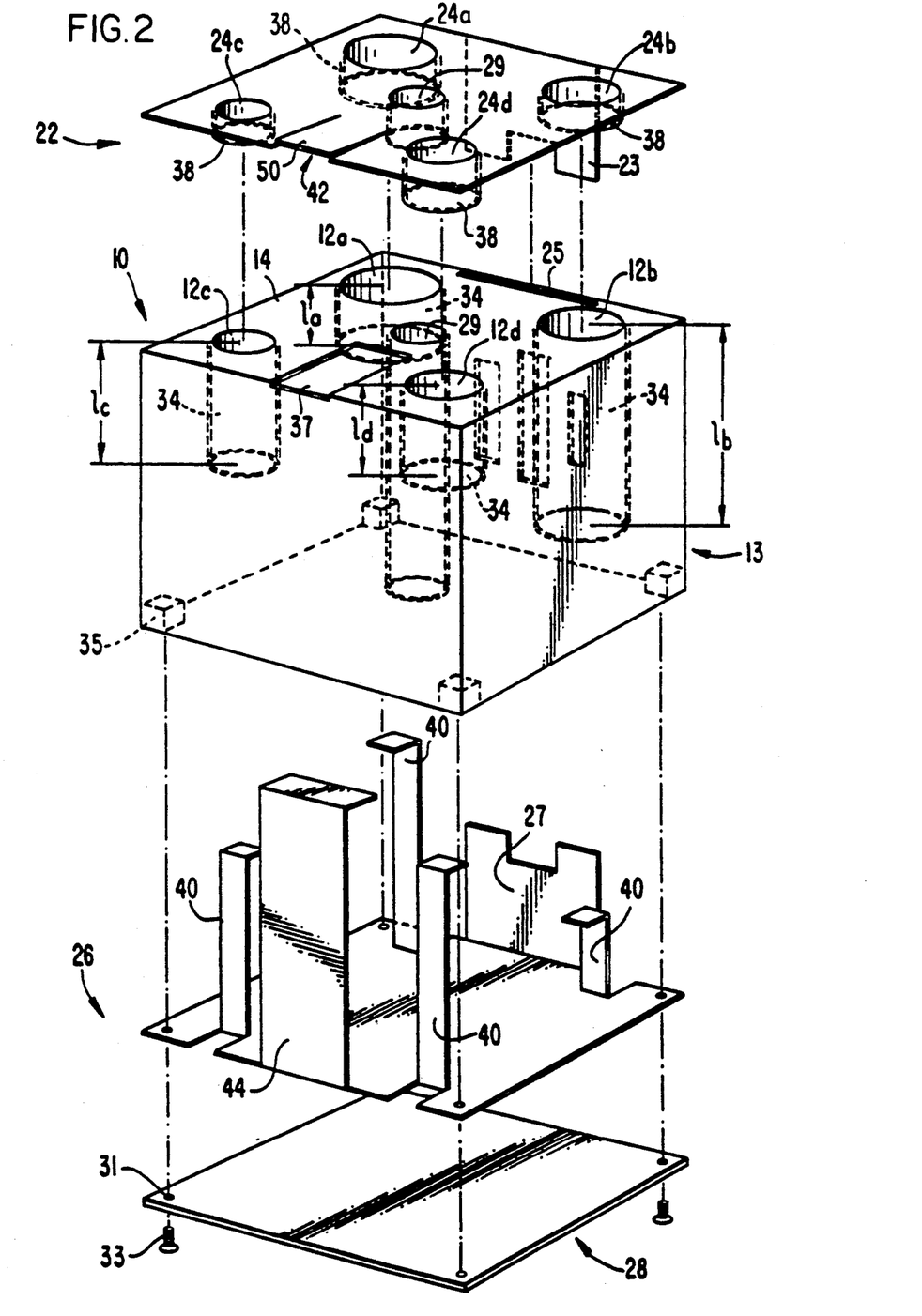
FIG. 2 is an exploded view of the fuse tester according to the embodiment shown in FIG. 1.

As shown in FIGS. 1-3A, main body 10 has different sized receptacles 12 formed in one of its sides 14 for receiving different sized household fuses 16. The receptacles preferably are in the shape of hollow cylinders. An adjacent side 13 of the main body 10 has receptacles 15 for receiving different sized automotive fuses 17. These side receptacles are elongated slots formed in the side of the main body. The dimensions of the receptacles 12 and 15 are designed so that the fuse tester can accommodate any standard household 16 or automotive 17 fuse. For example, as shown in FIG. 2, four receptacles 12a-12d are provided for receiving four different sized household fuses 16a-16d. Each receptacle has a different diameter and a different length to accommodate a different type of household fuse.

Figure 3:
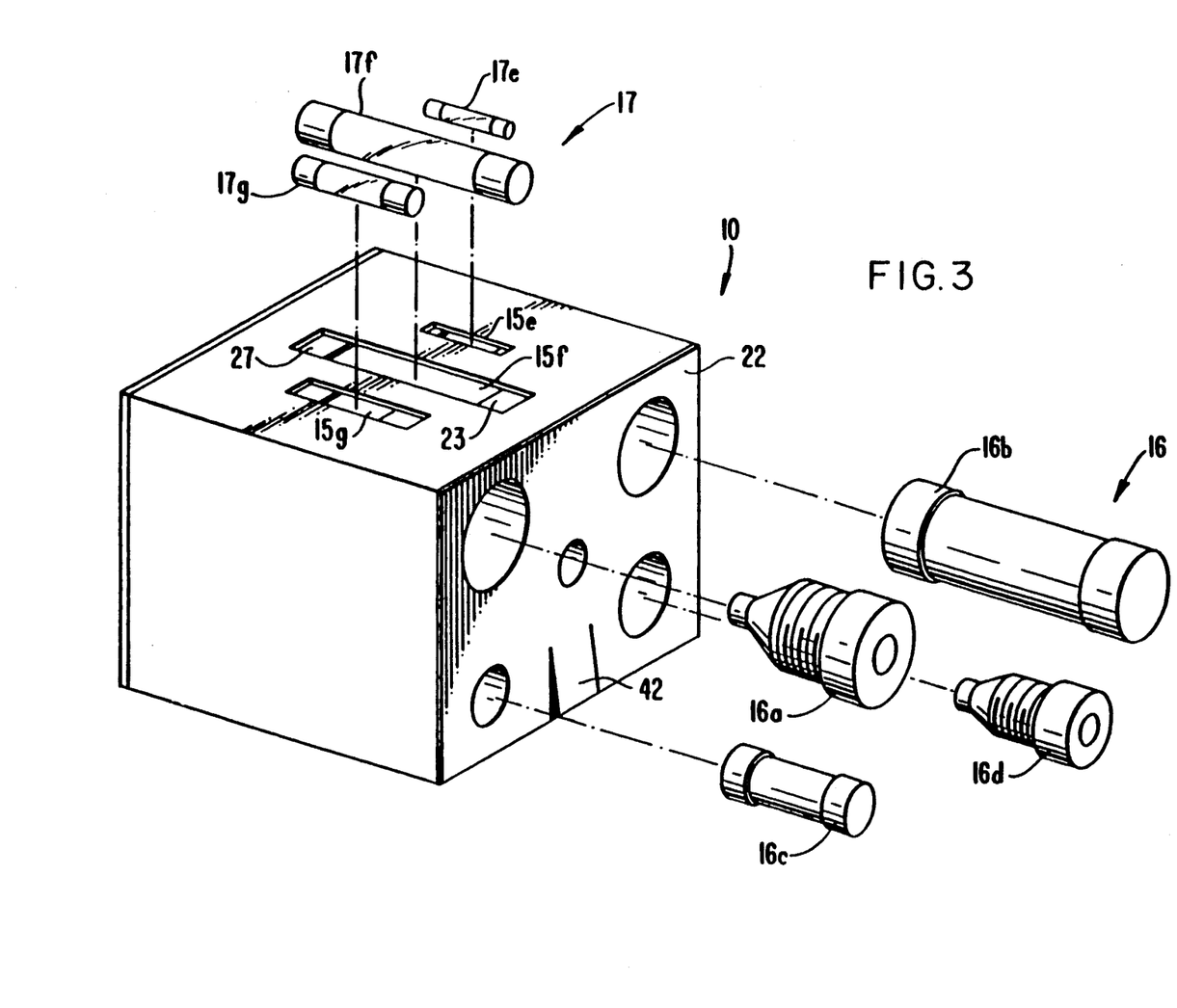
FIG. 3 is a perspective view of the fuse tester according to the embodiment shown in FIG. 1, and showing the fuse tester adapted to receive several different size fuses.
Figure 3A:
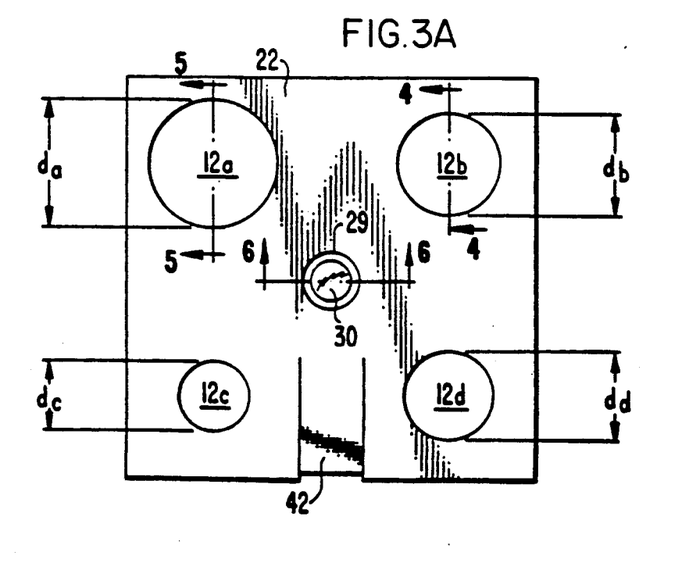
FIG. 3A is a top view of the fuse tester according to the embodiment shown in FIG. 1.

As shown in FIGS. 2 and 3A, receptacle 12a has a diameter da of 1.035 inches and a length la of 1.25 inches and is adapted to receive a Fuse-Tron fuse 16a. Receptacle 12b has a diameter db of 0.825 inches and a length lb of 2.75 and is sized to receive a 60 amp cartridge type fuse. Receptacle 12c has a diameter dc of 0.57 inches and length lc of 2.0 inches and is sized to receive a 30 amp cartridge type fuse. Finally, receptacle 12d has a diameter dd of 0.73 inches and length ld of 1.0 inch and is sized to receive a Fuse-State type fuse. While the size of the receptacles can be varied, the inventor has found that these four sizes accept most standard household fuses.

Figure 7:
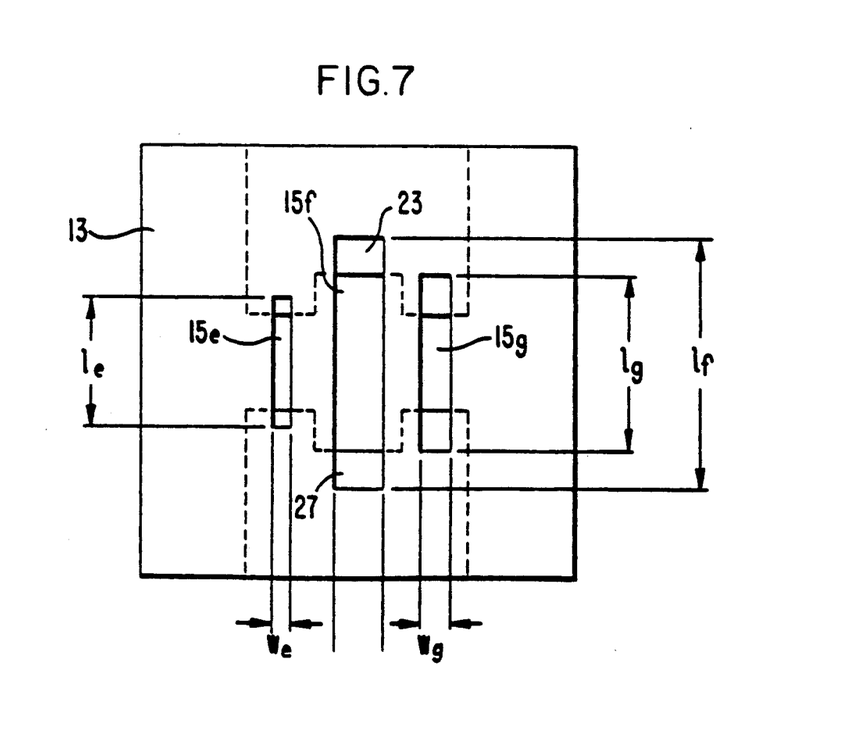
FIG. 7 is a side view of the fuse tester according to the embodiment shown in FIG. 1.

As shown in FIG. 7, with respect to the automotive fuses 17, three receptacles 15e-15g are provided each having a different length and width as shown in FIG. 7. Receptacle 15e has a length le of 0.6 inches and width we of 0.05 inches. Receptacle 15f has a length lf of 1.4 inches and width wf of 0.28 inches. Receptacle 15g has length lg of 1.0 inch and width wf of 0.28 inches. These sized receptacles allow the fuse tester to accommodate most standard size automotive fuses.

As is known in the art, a fuse has two connection points, such as connection points 18 and 20. A fuse is tested by placing a fuse in a receptacle of the main body. When a fuse is positioned in the appropriate receptacle, one connection point of the fuse contacts the first conductor 22, and the other connection point of the fuse contacts the second conductor 26. If the fuse is operable, the fuse then forms an electrical connection between the first conductor 22 and the second conductor 26.

As shown in FIGS. 1 and 2 a first conductor 22 includes a plate portion that is arranged on the side 14 of the main body having receptacles 12. The plate portion of the first conductor 22 has apertures 24 aligned with the receptacles 12 for contacting one of the connection points 18 of a household fuse 16. The first conductor 22 also includes an extension 23 which extends downward into a slit 25 of the main body for contacting one of the connection points 18 of an automotive fuse 17.

A second conductor 26 includes a plate portion that is arranged on a side 28 of the main body opposing the side 14 for contacting the other of the connection points 20 of the household fuse 16. The second conductor 26 also has an extension 27 for contacting the other of the connection points of the automotive fuse 17. An indicator 30 and a power source 32 for providing power to the indicator 30 are arranged in series with a fuse 16, 17 in one of the fuse receptacles 12, 15 such that if the fuse 16, 17 is operative, an electrical circuit will be formed and power is provided to the indicator 30. If the fuse 16, 17 is blown, a gap in the electrical circuit is formed and power does not flow to the indicator.

In the preferred embodiment of the invention, the main body 10 is hollow and box-shaped and the receptacles 12 for the household fuses 16 are hollow cylinders 34 which protrude into the main body 10. The receptacles 15 for the automobile fuses 17 preferably are elongated rectangular slots formed in the side 13 of the main body 10. As shown in FIG. 2, the first conductor 22 has apertures 24 aligned with the receptacles 12 and preferably includes hollow cylinders 38 extending within the hollow cylinders 34 of the main body.

Figure 4:
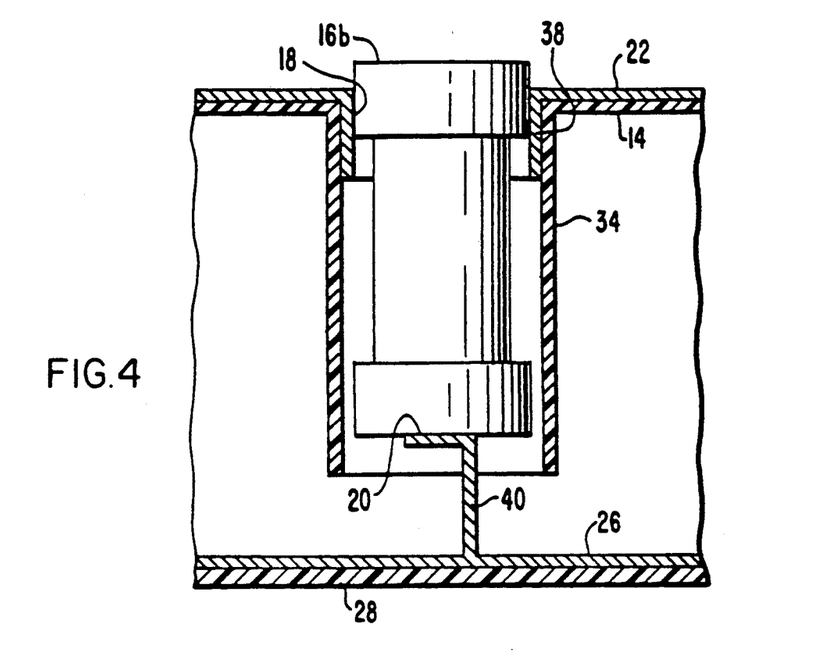
FIG. 4 is a part sectional view of the fuse tester taken along line 4—4 in FIG. 3A.
Figure 5:
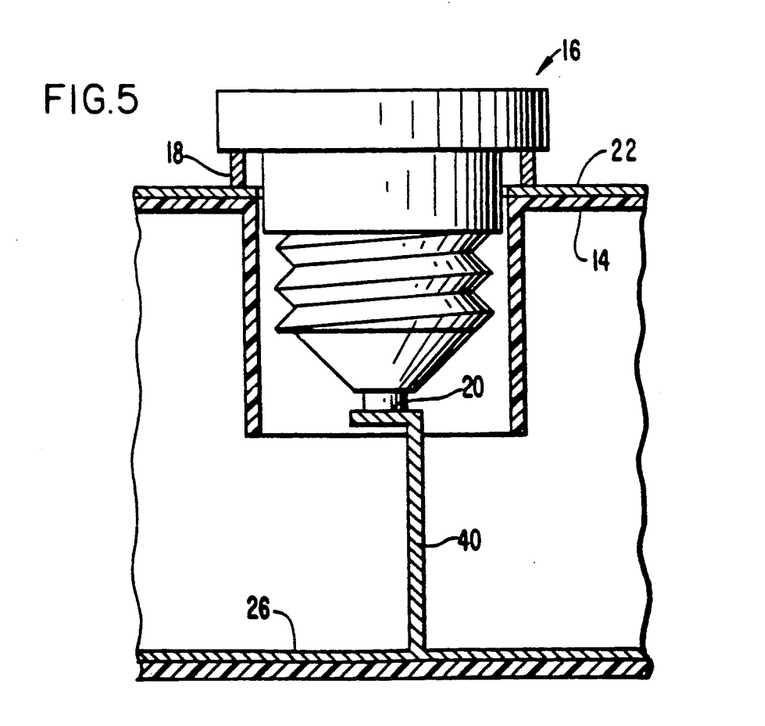
FIG. 5 is a part sectional view of a fuse tester taken along line 5—5 in FIG. 3A.

As shown in FIG. 4, these hollow cylinders 38 of the first conductor 22 contact one of the connection points 18 of the household fuse 16. Alternatively, as shown in FIG. 5, in the case of the receptacles without hollow conducting cylinders 38, the connection point 18 of the household fuse 16 contacts a portion of the first conducting plate 22 in the area of the aperture 24 aligned with the receptacle 12 for the fuse 16. The first conductor also preferably includes an extension 23 which extends downward into the area of the receptacles 15 for contacting one of the connection points 18 of the automotive fuses 17.

As shown in FIGS. 2 and 4, the second conductor 26 includes a plate portion arranged on the side 28 opposing the receptacles 12 and has projections 40 extending predetermined distances into the hollow cylinders 34 of the main body 10 for contacting another connection point 20 of the household fuse 16. As best seen in FIGS. 2 and 7, the second conductor 26 also includes an extension 27 which extends upward into the area of the receptacles 15 for contacting the other connection point 20 of the automotive fuses 17.

A further receptacle 29 is provided in the main body for the power source 32 and the indicator 30. A spring 39 urges the power source against the indicator so as to maintain constant contact between the indicator and the conductor 22. The power source and indicator are shown as a battery and a lamp, which is the preferred embodiment. The power source 32 and indicator 30 could take a variety of forms including, for example, an electrical plug for plugging into a conventional electric socket. The indicator could be various electrical indicating devices, such as a buzzer, a diode, or the like.

As shown in FIG. 2, the side 28 of the main body 10 which receives the plate portion of the second conductor 26 is detachable from the rest of the main body to allow for easy access to the powers source and the indicator. Accordingly, the bottom plate 28 includes apertures 31 for receiving screws 33 which are screwed into blocks 35 arranged on each of the bottom four corners of the main body 10. To change the battery or lamp, the bottom of the fuse tester may be removed by removing the screws and the bottom plate 28, replacing the lamp and/or battery, and screwing the bottom plate 28 back onto the main body. Additionally, the battery 32 may be further accessible by providing a conventional ¼ turn battery insert closure (not shown) in the bottom or top of the main body.

In the preferred embodiment of the invention, a tester switch shown generally as 42 is provided for testing the operativeness of the fuse tester itself. If a fuse 16, 17 is inserted in one of the receptacles 12, 15 and the indicator 30 does not light, the cause could be a defective fuse 16, 17, a defective indicator 30, or an uncharged battery 32. The tester 42 for the fuse tester provides a means to test whether or not the power source 32 and indicator 30 are in working order. The tester 42 operates by bypassing the fuse and directly connecting the first and second conductors 22 and 26. The tester 42 therefore completes an electrical circuit causing he power source to power the indicator if both are operable. If the indicator 30 lights, the operator is assured that the fuse tester is functioning properly. If the indicator 30 does not light, the operator knows that the power source and/or the indicator require replacement.

The preferred embodiment of the tester 42 shown in FIG. 2, includes a tab 50 formed on the first conductor 22 and a complementary projection 44 formed as part of the second conductor 26. The projection 44 extends upwardly toward the first conductor 22 and, when the device is assembled, terminates just short of the first conductor plate. The tab is aligned with the projection 44 and is formed by making two elongated cuts from a side of the plate. The tab 50 is flexible but will also tend to spring back to its original position. Alternatively, a button could be used as receptive of the users finger to depress tab 50. Beneath the tab is an opening 37 in the main body 10, thereby allowing the tab to be slightly depressed. To test the device, tab 42 is pressed down to contact projection 44, and the circuit is completed.

The main body 10 is preferably vacuum formed from plastic and includes four sides, a top 14 having apertures 12 and cylinders 43 extending therefrom, and an open bottom. An opening 37 is formed in the top 14 in the area of the main body receiving the test tab 42 of the first conductor 22. Similarly the bottom 28 of the main body is made from plastic.

According to the preferred embodiment, the first conductor 22 is made of a thin stamped sheet of metal material. The first conductor 22 preferably includes a plate portion, conducting cylinders 38, a test tab 42, and an extension 23. The plate portion of the metal conductor is fixed to the main body by conventional means such as a glue, screws, or the like.

As an alternative, the first conductor can be made of conductive, adhesive tape. Such tape can be adhered to the main body by simply pressing the tape against the main body. If tape is used, it may be necessary to design the main body to include a test tab where the opening is in the preferred embodiment, since the tape itself is not very rigid. The tape then would be wrapped on the underside of the test tab 42 for contacting the testing extension 44. The conducting tape can also be designed so that the tape may be pushed down into the plastic cylinders 34 of the main body 10 to form the "conducting cylinders" 38. Similarly, a portion of the tape can be wrapped around the side of the main body so that the tape extends into elongated slots 15.

In the preferred embodiment, the top surface of the first conductor 22 includes printed instructions for operating the fuse tester. Other printed matter may include the specific sizes of the receptacles and the conventional names of the various fuses appropriate for each receptacle. The printed instructions preferably are included on a non-conductive overlay providing electrical insulation and increasing the safety of the device. A similar overlay may also be provided on the side 13 of the cube for receiving the automotive fuses 17.

The second conductor 26 is preferably stamped from a thin sheet metal. Certain cuts are made in the sheet metal to form the projections 40 and the second extension 27. Once cut, the projections 40 are bent to a 90° angle from the flat plate portion of the bottom conductor 26 for projecting into the receptacles 12 as shown in FIG. 2. The second extension is also bent to a 90° angle to project into the receptacles 15 for the automotive fuses 17. An additional 90° bend at the end of the projections 40 provides a flat contact surface to contact the household fuse 16.

As shown in FIG. 2, the bottom of the main body of the fuse tester is flat plastic plate 28. The plate portion of the second conductor 26 is positioned on the bottom plastic plate 28 and, if desired, can be glued or otherwise attached to the plate 28. The two plates are then attached to the rest of the main body by screws 33 which extend through apertures 31 formed in the four corners of the two plates. Blocks 35 are arranged in each bottom corner of the main body for receiving the screws.

By this detachable arrangement, the fuse tester may be easily assembled during manufacture and easily disassembled for replacing a defective power source and/or illuminator. Additionally, the detachable plastic plate may be provided with a conventional one quarter turn-type battery insert which can be easily removed from the main body without removing the entire bottom plastic plate 28.

The fuse tester of the present invention is easy to manufacture, assemble and use. In assembly, the first conductor 22 is attached to the top of the main body after the extension 23 is inserted into the slot 25 in the main body and the corresponding conducting cylinders 38 are inserted into their corresponding plastic cylinders 34. The indicator lamp 30 is then positioned within the battery receptacle, followed by the battery 32 and the spring 39. The second conductor plate 26 is then placed on the bottom plate 28, and the two plates are attached to the main body 10 with screws 33. The tester is then fully assembled and ready for use.

Figure 6:
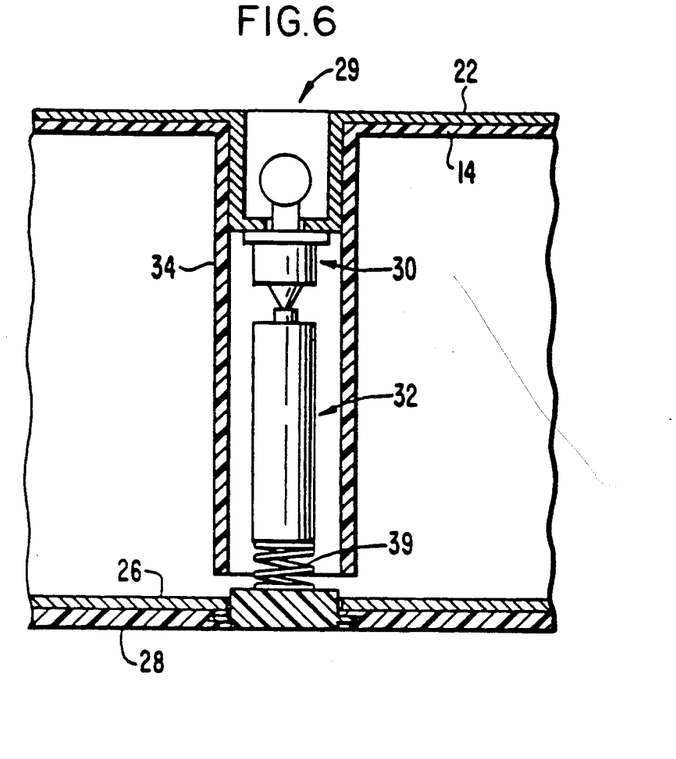
FIG. 6 is a part sectional view of the fuse tester taken along line 6—6 in FIG. 3A.

In operation, a fuse is inserted into the appropriately sized receptacle. In the case of a standard household fuse 16, one of the four top cylindrical receptacles are used. In the case of a standard automobile fuse 17, one of the three rectangular receptacles on a side 13 of the fuse tester is used. As shown in FIGS. 4, 5 and 7, the fuse contacts the first and second connection points, respectively. As shown in FIG. 6, the battery and lamp are also in contact with the first and second conductors. Therefore, if the fuse is good, an electrical circuit is formed, whereby the power source 32 provides power to the indicator 30 and the indicator lights. If the lamp does not light, the operator can depress the tester tab 42 to insure that the lamp and battery are operating and that the failure of the lamp to light is due to a blown fuse and not due to a blown lamp or dead battery.

It will be apparent to those skilled in the art that various modifications and variations can be made in the fuse tester of the present invention and in the construction of this fuse tester without departing from the scope or spirit of the invention. As an example, the elements of the tester can be made from a wide variety of elements, and the device can utilize a variety of power sources, including solar power as well as external power provided by a plug adapted for a conventional wall outlet.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Because many varying and different embodiments may be made within the scope of the inventive concept herein taught, and because many modifications may be made in the embodiments herein detailed in accordance with the descriptive requirement of the law, it is to be understood that the details herein are to be interpreted as illustrative and not in a limiting sense.

What is claimed as invention is:

1. A device for testing a variety of different sized fuses, each fuse having two connection points, the device comprising:
    a) a non-conductive cube shaped main body having multiple sides and a first plurality of rounded receptacles of different sizes, each receptacle having an opening on a first side of the cube, each receptacle being sized to accommodate a different size fuse that can enter the receptacle at its opening;
    b) first conducting plate means adjacent each of said receptacles for contacting one connection point of a fuse and the first side of the cube, when the fuse is inserted into one of said receptacles;
    c) second conducting plate means on a second side of the cube that is opposite to and parallel with the first side and electrically insulated from the first conducting plate means, said second conducting plate means being associated with each of said receptacles for contacting the other connection point of a fuse when it is inserted into one of said receptacles;
    d) said second conducting plate means having a plurality of terminal portions corresponding to the plurality of receptacles and being positioned at differing distances respectively from the first side of the cube, so that fuses of different lengths can be tested by placing a fuse to be tested in one of the various receptacles;
    e) indicating means for indicating the operability of said fuse, said indicating means being in electrical connection with one of said first and second conducting plate means;
    f) a power source in electrical connection with the indicating means and with the other of said first and second conducting plate means wherein when an operative fuse is inserted into a receptacle that is sized to accept it, an electrical circuit is formed to power said indicating means.

2. The device of claim 1 wherein said second conducting plate means includes one or more laterally spaced apart projections, each extending a distance between the first and second plate means, each of which extends a predetermined distance into a respective receptacle, the distances varying from one projection to the next in order at different receptacles to accommodate various length fuses.

3. The device of claim 1 wherein said receptacles are a plurality of hollow cylindrically shaped sockets, having different diameters to accommodate various diameter fuses.

4. The device of claim 3 wherein said first conducting plate means is a flat conducting plate having a plurality of apertures therein of different diameters aligned with said hollow cylinders and sized to accept respective fuses.

5. The device of claim 4 wherein said second conducting plate means is a second conducting plate having a plurality of terminals projecting therefrom at right angles thereto, each projection extending a predetermined distance into a respective receptacle, and said first conducting plate means includes conductive tubular sleeves extending a distance away from the second conducting plate and into at least some of said receptacles.

6. The device of claim 5 wherein the cube shaped main body has at least two correspondingly shaped opposing rectangular sides, said first conducting plate being positioned on said first opposing side of the cube shaped body and said second conducting plate being positioned on said second opposing side, a third conductor plate extends from said first conducting plate, and a fourth conducting plate extends from said second conducting plate toward the third conducting plate closely approaching same, with a non-conductive gap therebetween.

7. The device of claim 6 wherein said opposing sides of the main body have inner and outer surfaces, and wherein said first conducting plate is positioned on the inner surface of said first opposing sides and said second conducting plate is positioned on the inner surface of said second opposing side.

8. The device of claim 5 wherein said second conducting plate is formed from a single sheet of conductive material, said projections being attached to the single sheet.

9. The device of claim 8 further comprising a resilient means for forcing the power source against the indicating means and forcing the indicating means against one of the first and second conducting plates.

10. The device of claim 9 further comprising a test switch for testing the operability of the indicating means, said test switch forming an electrical circuit between the first and second conducting plates through which current may flow when the indicating means is operative.

11. The device of claim 10 wherein the indicating means is a lamp.

12. The device of claim 11 wherein the power source is a battery.

13. The device of claim 1 or 12 wherein the main body is made of a plastic material.

14. The device of claim 1 wherein said test switch means includes a tester projection integral with said second conducting means and extending toward and terminating proximate to said first conducting means and a flexible tab formed in said first conduction means and aligned with said tester projection, said flexible tab being capable of selectively contacting said tester projection.

15. The device of claim 1 wherein said receptacles include cylinders formed in said main body and extending between said first and second conducting means and having different diameters to accommodate various sized fuses and elongated slots formed in a side of said main body and extending between said first and second conducting means, the receptacles having different lengths and widths to accommodate various sized fuses.

16. The device of claim 15 wherein said second conducting means includes one or more projections, each of which extends a predetermined distance into a respective receptacle, the distance varying to accommodate various sized fuses.

17. The device of claim 16 wherein said first conducting means includes a conducting plate having apertures aligned with said cylinders and sized to accept respective fuses, and an extension extending along the side of the main body into said elongated slots.

18. A device for testing a variety of different sized fuses each having first and second end connection points, the device comprising:
 a) a nonconductive cube shaped main body having a plurality of rectangular sides and a plurality of elongated receptacles, for receiving fuses each of said receptacles having an opening on one of said sides and being sized to accommodate a fuse, at least one of the fuse connection points being positioned adjacent to the said first side during testing;
 b) a first conducting plate attached to said main body at said first side adjacent to each of said receptacles, for contacting the first end portion connection point of a fuse when it is inserted into one of said receptacles for testing;
 c) a second conducting plate attached to said main body on a second side that is opposite and parallel to the first side, electrically insulated from said first conducting plate, said second conducting plate having various terminals of differing lengths projecting therefrom in a direction away from the second conducting plate associated with each of said receptacles for contacting a second end connection point of a fuse when it is inserted into one of said receptacles;
 d) a battery receptacle formed in said main body for accepting a battery power source;
 e) indicating means for indicating the operability of said fuse, said indicating means being in electrical connection with one of said first and second conducting plates;
 f) a battery housed within said battery receptacle and in electrical connection with the indicating means and with the other of said first and second conducting plates wherein when an operative fuse is inserted into a receptacle sized to accept it, an electrical circuit is formed to power said indicating means.

19. The device of claim 18 wherein said indicating means is a light bulb, a part of which extends into said battery receptacle.

20. The device of claim 19 wherein said first conducting plate includes projections in the form of cylindrical sleeves which project into at least some of said receptacles.

* * * * *